(12) United States Patent
Zhou et al.

(10) Patent No.: US 11,887,996 B2
(45) Date of Patent: Jan. 30, 2024

(54) PIXEL DRIVING CIRCUIT, METHOD THEREOF AND DISPLAY PANEL

(71) Applicants: Mianyang HKC Optoelectronics Technology Co., Ltd., Sichuan (CN); HKC CORPORATION LIMITED, Shenzhen (CN)

(72) Inventors: Renjie Zhou, Mianyang (CN); Haijiang Yuan, Mianyang (CN)

(73) Assignees: Mianyang HKC Optoelectronics Technology Co., Ltd., Mianyang (CN); HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 17/974,709

(22) Filed: Oct. 27, 2022

(65) Prior Publication Data

US 2023/0178570 A1 Jun. 8, 2023

(30) Foreign Application Priority Data

Oct. 29, 2021 (CN) .......................... 202111279541.9

(51) Int. Cl.
| | |
|---|---|
| *G09G 5/00* | (2006.01) |
| *H01L 27/12* | (2006.01) |
| *G09G 3/30* | (2006.01) |

(52) U.S. Cl.
CPC .......... *H01L 27/1255* (2013.01); *G09G 3/30* (2013.01); *G09G 2310/0264* (2013.01); *G09G 2320/0233* (2013.01)

(58) Field of Classification Search
CPC ... G09G 2300/0819; G09G 2310/0262; G09G 2310/0264; G09G 2320/0233; G09G 2320/0626; G09G 3/30; G09G 3/32; G09G 3/3233; H01L 27/1255
See application file for complete search history.

(56) References Cited

U.S. PATENT DOCUMENTS

| | | | |
|---|---|---|---|
| 8,698,706 B1 | 4/2014 | Rutherford | |
| 2011/0164021 A1* | 7/2011 | Seto | G09G 3/3233 345/76 |
| 2020/0302873 A1* | 9/2020 | Yamazaki | G09G 3/3266 |

FOREIGN PATENT DOCUMENTS

| | | |
|---|---|---|
| CN | 101542572 A | 9/2009 |
| CN | 103400548 A | 11/2013 |
| CN | 104813390 A | 7/2015 |
| CN | 105047131 A | 11/2015 |

(Continued)

*Primary Examiner* — Insa Sadio
(74) *Attorney, Agent, or Firm* — Maier & Maier, PLLC

(57) ABSTRACT

A pixel driving circuit, a method thereof, and a display panel, related to the field of display technology. The pixel driving circuit includes: a first charging unit, a discharging unit, a second charging unit, an energy storage capacitor and a driving transistor. The first charging unit is configured for pre-charging the energy storage capacitor. The discharge unit is configured for discharging the voltage of the pre-charged energy storage capacitor to a preset voltage. The second charging unit is configured for inputting the data voltage to the storage capacitor. After the second charging unit charges the energy storage capacitor, the voltage of the energy storage capacitor is equal to the sum of the preset voltage and the data voltage. The energy storage capacitor is connected to the gate electrode of the driving transistor.

14 Claims, 4 Drawing Sheets

(56) References Cited

FOREIGN PATENT DOCUMENTS

| | | | |
|---|---|---|---|
| CN | 108475490 | A | 8/2018 |
| CN | 109785800 | A | 5/2019 |
| CN | 112992036 | A | 6/2021 |
| JP | 2004157467 | A | 6/2004 |

* cited by examiner

PIXEL DRIVING CIRCUIT, METHOD THEREOF AND DISPLAY PANEL

CROSS REFERENCE TO RELATED APPLICATION

Pursuant to 35 U.S.C. § 119 and the Paris Convention Treaty, this application claims the benefit of Chinese Patent Application No. 202111279541.9 filed Oct. 29, 2021, the contents of which are incorporated herein by reference.

TECHNICAL FIELD

The present application relates to the technical field of display technology, and more particularly to a pixel driving circuit, a method thereof and a display panel.

BACKGROUND

Organic Light-Emitting Diode (OLED) display panels include Active-Matrix Organic Light-Emitting Diode (AMOLED) display panels and Passive-Matrix Organic Light-Emitting Diode (PMOLED) display panels. The AMOLED display panels mean that each sub-pixel in the display panel is connected with a pixel driving circuit. The pixel driving circuit is configured for driving the sub-pixels to emit light.

In the related art, a pixel driving circuit generally includes a switching transistor, a driving transistor and an energy storage capacitor. When the switching transistor is turned on, the data voltage is stored in the energy storage capacitor through the switching transistor. After the switching transistor is turned off, the energy storage capacitor discharges to the gate electrode of the driving transistor, so that the driving transistor is turned on. When the driving transistor is turned on, a driving current is outputted to the sub-pixels to drive the sub-pixels to emit light.

However, the driving transistor has a threshold voltage, which will reduce the driving current output by the driving transistor to the sub-pixels, thereby the light-emitting brightness of the sub-pixels is dark.

SUMMARY

The present application provides a pixel driving circuit, a method thereof and a display panel, which can solve the technical problem that the light-emitting brightness of the sub-pixels in the related art is dark. The technical solution is as follows:

In a first aspect, a pixel driving circuit for driving sub-pixels to emit light is provided, and the pixel driving circuit includes: a first charging unit, a discharging unit, a second charging unit, an energy storage capacitor, and a driving transistor;

an input terminal of the first charging unit is configured for inputting a pre-charge voltage, and an output terminal of the first charging unit is connected to an energy storage capacitor, so as to charge the energy storage capacitor when the first charging unit is turned on;

a first terminal of the discharging unit is connected to the energy storage capacitor, and a second terminal of the discharging unit is connected to a ground, so as to discharge a voltage of the energy storage capacitor to a preset voltage when the discharging unit is turned on;

an input terminal of the second charging unit is configured for inputting a data voltage, and an output terminal of the second charging unit is connected to the energy storage capacitor, so as to charge the energy storage capacitor when the second charging unit is turned on; and a first electrode of the driving transistor is configured for inputting a power supply voltage, a second electrode of the driving transistor is configured for connecting with the sub-pixels, and a gate electrode of the driving transistor is connected to the energy storage capacitor, so as to emit light through the sub-pixels when the energy storage capacitor discharges the gate electrode of the driving transistor.

In the present application, the first charging unit is configured for pre-charging the energy storage capacitor. The discharging unit is configured for discharging the voltage of the pre-charged energy storage capacitor to a preset voltage. The second charging unit is configured for inputting the data voltage to the energy storage capacitor after the energy storage capacitor is discharged through the discharging unit. After the second charging unit charges the energy storage capacitor, the voltage of the energy storage capacitor is equal to the sum of the preset voltage and the data voltage. The energy storage capacitor is connected to the gate electrode of the driving transistor, that is, when the driving transistor is turned on, the voltage output by the energy storage capacitor to the gate electrode of the driving transistor is equal to the sum of the preset voltage and the data voltage. In this way, the voltage output from the energy storage capacitor to the gate electrode of the driving transistor is increased, so that the driving current output by the driving transistor to the sub-pixels can be increased, and the light-emitting brightness of the sub-pixel can be improved.

In an embodiment, the first charging unit includes a first switching transistor, the discharging unit includes a second switching transistor, and the second charging unit includes a third switching transistor;

a first electrode of the first switching transistor is configured for inputting the pre-charge voltage, and a second electrode of the first switching transistor is connected to the energy storage capacitor;

a first electrode of the second switching transistor is connected to the energy storage capacitor, and a second electrode of the second switching transistor is configured for connecting to the ground; and a first electrode of the third switching transistor is configured for inputting the data voltage, and a second electrode of the third switching transistor is connected to the energy storage capacitor.

In an embodiment, the first electrode of the first switching transistor is connected to the first electrode of the driving transistor, and the pre-charge voltage is the power supply voltage.

In an embodiment, the first charging unit includes a first switching transistor, the discharging unit includes a second switching transistor, and the second charging unit multiplexes the first switching transistor, and the pre-charge voltage is the data voltage;

a first electrode of the first switching transistor is configured for inputting the data voltage, and a second electrode of the first switching transistor is connected to the energy storage capacitor; and a first electrode of the second switching transistor is connected to the energy storage capacitor, and a second electrode of the second switching transistor is configured for connecting to the ground.

In an embodiment, the pixel driving circuit further includes: a third switching transistor; a first electrode of the third switching transistor is connected to the energy storage capacitor, and a second electrode of the third switching transistor is connected to a gate electrode of the driving transistor;

the discharging unit further includes:
a fourth switching transistor, a first electrode of the fourth switching transistor is connected to the energy storage capacitor, and a second electrode of the fourth switching transistor is connected to the first electrode of the second switching transistor.

In a second aspect, a method for pixel driving is provided, which is applied to the pixel driving circuit of any one of the first aspect, and the method for pixel driving includes:

controlling, during a first period of time, the first charging unit to be turned on to charge the energy storage capacitor;

controlling, during a second period of time, the first charging unit to be turned off and the discharging unit to be turned on, to discharge a voltage of the energy storage capacitor to a preset voltage;

controlling, during a third period of time, the discharging unit to be turned off and the second charging unit to be turned on, to charge the energy storage capacitor, wherein the voltage of the energy storage capacitor is a sum of the preset voltage and the data voltage after the third period of time; and controlling, during a fourth period of time, the second charging unit to be turned off, such that the energy storage capacitor is discharged to the gate electrode of driving transistor, so that the sub-pixels emit light.

In an embodiment, the first charging unit includes a first switching transistor, the discharging unit includes a second switching transistor, and the second charging unit includes a third switching transistor;

the step of controlling, during a first period of time, the first charging unit to be turned on includes:

outputting, during the first period of time, a first scan signal to the gate electrode of the first switching transistor to control the first switching transistor to be turned on;

the step of controlling, during a second period of time, the first charging unit to be turned off and the discharging unit to be turned on includes:

stopping, during the second period of time, to output the first scan signal to control the first switching transistor to be turned off, and outputting a second scan signal to the gate electrode of the second switching transistor to control the second switching transistor to be turned on;

the step of controlling, during a third period of time, the discharging unit to be turned off and the second charging unit to be turned on includes:

stopping, during the third period of time, to output the second scan signal to control the second switching transistor to be turned off, and outputting a third scan signal to the gate electrode of the third switching transistor to control the third switching transistor to be turned on; and the step of controlling, during the fourth period of time, the second charging unit to be turned off includes:

stopping, during the fourth period of time, to output the third scan signal to control the third switching transistor to be turned off.

In an embodiment, the first charging unit includes a first switching transistor, the discharging unit includes a second switching transistor, and the second charging unit multiplexes the first switching transistor, and the pre-charge voltage is the data voltage;

the step of controlling, during a first period of time, the first charging unit to be turned on to charge the energy storage capacitor includes:

outputting, during the first period of time, a first scan signal to the gate electrode of the first switching transistor to control the first switching transistor to be turned on;

the step of controlling, during a second period of time, the first charging unit to be turned off and the discharging unit to be turned on includes:

stopping, during the second period of time, to output the first scan signal to control the first switching transistor to be turned off, and outputting a second scan signal to the gate electrode of the second switching transistor to control the second switching transistor to be turned on;

the step of controlling, during a third period of time, the discharging unit to be turned off and the second charging unit to be turned on includes:

stopping, during the third period of time, to output the second scan signal to control the second switching transistor to be turned off, and outputting the first scan signal to the gate electrode of the first switching transistor to control the first switching transistor to be turned on; and the step of controlling, during the fourth period of time, the second charging unit to be turned off includes:

stopping, during the fourth period of time, to output the first scan signal to control the first switching transistor to be turned off.

In an embodiment, the pixel driving circuit further includes: a third switching transistor; a first electrode of the third switching transistor is connected to the energy storage capacitor, and a second electrode of the third switching transistor is connected to a gate electrode of the driving transistor; the discharging unit further includes: a fourth switching transistor; a first electrode of the fourth switching transistor is connected to the energy storage capacitor, and a second electrode of the fourth switching transistor is connected to the first electrode of the second switching transistor;

the method further includes:

outputting, during the second period of time, a fourth scan signal to the gate electrode of the fourth switching transistor to control the fourth switching transistor to be turned on; and outputting, during the fourth period of time, a third scan signal to the gate electrode of the third switching transistor to control the third switching transistor to be turned on.

In a third aspect, a display panel is provided, which includes sub-pixels and the pixel drive circuit of any one in the first aspect;

the second electrode of the driving transistor is connected to the sub-pixels, such that when the energy storage capacitor discharges to the gate electrode of the driving transistor, the driving transistor drives the sub-pixels to emit light.

In a fourth aspect, a display device is provided, which includes the display panel described in the third aspect and a timing controller; the timing controller is connected to a pixel driving circuit in the display panel, for executing the method according to any one of the second aspect.

It can be understood that, for the beneficial effects of the second aspect, the third aspect and the fourth aspect, reference may be made to the relevant descriptions in the first aspect, which will not be repeated here.

BRIEF DESCRIPTION OF THE DRAWINGS

In order to explain the embodiments of the present application more clearly, a brief introduction regarding the accompanying drawings that need to be used for describing the embodiments of the present application or the prior art is given below; it is obvious that the accompanying drawings described as follows are only some embodiments of the present application, for those skilled in the art, other drawings can also be obtained according to the current drawings on the premise of paying no creative labor.

DETAILED DESCRIPTION OF THE EMBODIMENTS

In order to make the objectives, technical solutions and advantages of the present application clearer, the embodiments of the present application will be further described in detail below with reference to the accompanying drawings.

It should be understood that the "plurality" mentioned in the present application refers to two or more. In the description of the present application, unless otherwise stated, "I" means or, for example, A/B can mean A or B; "and/or" in the present application is only an association relationship that describes an associated object, it means that there can be three kinds of relationships, for example, A and/or B, it can mean that A exists alone, A and B exist at the same time, and B exists alone. In addition, in order to facilitate the clear description of the technical solutions of the present application, words such as "first" and "second" are configured to distinguish the same items or similar items with basically the same function and effect. Those skilled in the art can understand that the words "first", "second" and the like do not limit the quantity and execution order, and the words "first", "second" and the like are not necessarily different.

Embodiment 1

Figure 1:
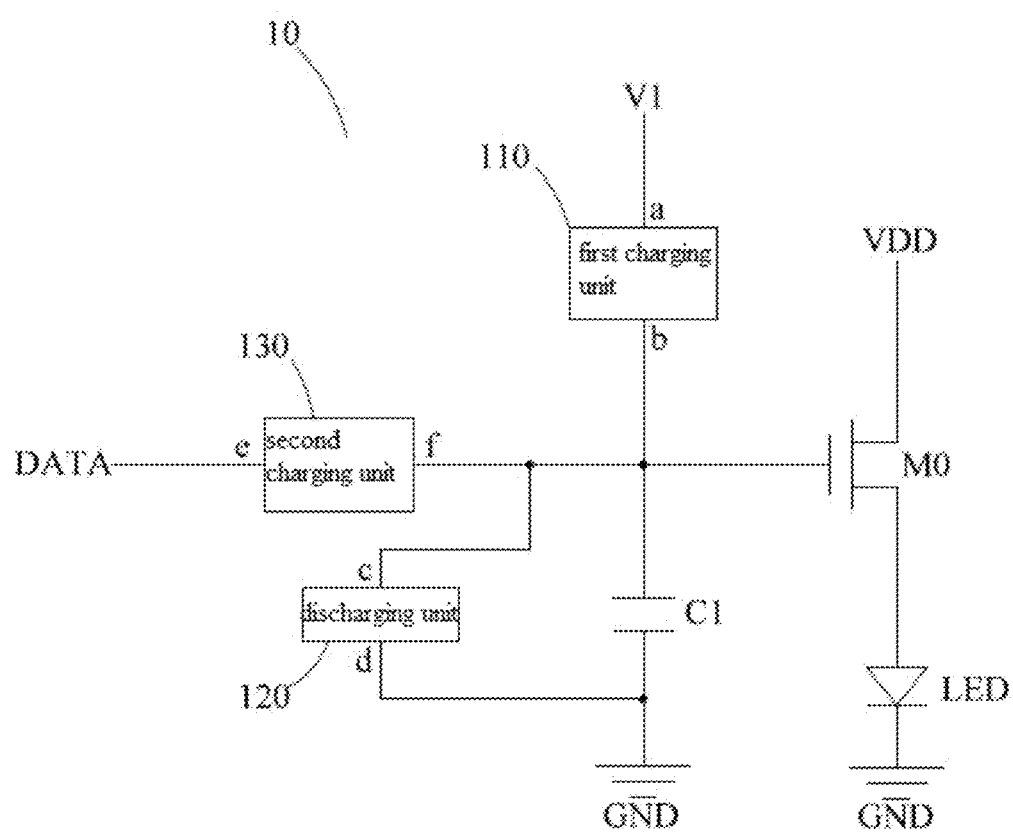
FIG. 1 is a schematic structural diagram of a pixel driving circuit provided in an embodiment 1 of the present application.

The pixel driving circuit is configured for driving the sub-pixels to emit light. Each sub-pixel here can be a Light-Emitting Diode (LED) unit, an OLED unit, a Micro LED unit or a Mini LED unit. FIG. 1 is a schematic structural diagram of a pixel driving circuit 10 provided in the embodiment 1 of the present application. As shown in FIG. 1, the pixel driving circuit 10 includes a first charging unit 110, a discharging unit 120, a second charging unit 130, an energy storage capacitor C1, and a driving transistor M0.

In an embodiment, the first charging unit 110 is provided with an input terminal a and an output terminal b. The input terminal a of the first charging unit 110 is configured to input the pre-charge voltage V1. The output terminal b of the first charging unit 110 is connected to the energy storage capacitor C1. In this way, when the first charging unit 110 is turned on, the pre-charge voltage V1 charges the energy storage capacitor C1 through the first charging unit 110, so that the voltage of the energy storage capacitor C1 is equal to the pre-charge voltage V1. The discharging unit 120 is provided with a first terminal c and a second terminal d. The first terminal c of the discharging unit 120 is connected to the energy storage capacitor C1, and the second terminal d of the discharging unit 120 is connected to the ground GND. In this way, when the discharging unit 120 is turned on, the charge stored in the energy storage capacitor C1 can be discharged to the ground GND through the discharging unit 120, so that the voltage of the energy storage capacitor C1 is discharged to a preset voltage. The second charging unit 130 is provided with an input terminal e and an output terminal f. The input terminal e of the second charging unit 130 is configured for inputting the data voltage DATA. The output terminal f of the second charging unit 130 is connected to the energy storage capacitor C1. In this way, when the second charging unit 130 is turned on, the data voltage DATA charges the energy storage capacitor C1 through the second charging unit 130, so that the voltage of the energy storage capacitor C1 is equal to the sum of the preset voltage and the data voltage DATA. The first electrode of the driving transistor M0 is configured for inputting the power supply voltage VDD, and the second electrode of the driving transistor M0 is configured for connecting with the sub-pixel LED. The gate electrode of the driving transistor M0 is connected to the energy storage capacitor C1. In this way, when the energy storage capacitor C1 discharges to the gate electrode of the driving transistor M0, the driving transistor M0 is turned on. At this time, the driving transistor M0 outputs a driving current to the sub-pixel LED to drive the sub-pixel LED to emit light.

The embodiment of the present application further provides a method for pixel driving, which is applied to the pixel driving circuit 10. The method for pixel driving is performed by a timing controller. When the method for pixel driving is started, the first charging unit 110, the discharging unit 120, the second charging unit 130, and the driving transistor M0 are all in an off state.

The working process of the pixel driving circuit 10 will be explained below with reference to the method for pixel driving. The method for pixel driving includes the following steps S110 to S140:

S110; controlling, during a first period of time, the first charging unit 110 to be turned on to charge the energy storage capacitor C1.

The first period of time is a continuous period of time. During the first period of time, the first charging unit 110 is controlled to be in an on state, so as to continuously charge the energy storage capacitor C1, so that when the first period of time ends, the voltage of the energy storage capacitor C1 is equal to the pre-charge voltage V1.

S120; controlling, during a second period of time, the first charging unit 110 to be turned off and the discharging unit 120 to be turned on, to discharge a voltage of the energy storage capacitor C1 to a preset voltage.

The second period of time is a continuous period of time, and the second period of time follows the first period of time. Generally, no time interval is existed between the second period of time and the first period of time, or a short time interval is existed between the second period of time and the first period of time. There is no time interval between the second period of time and the first period of time, which means that the end moment of the first period of time is the start moment of the second period of time. During the second period of time, the first charging unit 110 is controlled to be in the off state, and the discharging unit 120 is controlled to be in the on state, so that the energy storage capacitor C1 is continuously discharged, so that the voltage of the capacitor C1 is equal to the preset voltage after the second period of time ends.

S120; controlling, during a third period of time, the discharging unit 120 to be turned off and the second charging unit 130 to be turned on, to charge the energy storage capacitor C1, and the voltage of the energy storage capacitor C1 is a sum of the preset voltage and the data voltage DATA after the third period of time.

The third period of time is a continuous period of time, and the third period of time follows the second period of time. Generally, no time interval is existed between the third period of time and the second period of time, or a short time interval is existed between the third period of time and the second period of time. During the third period of time, the discharging unit 120 is controlled to be in the off state, and the second charging unit 130 is controlled to be in the on state, so as to continuously charge the energy storage capacitor C1, so that the voltage of the energy storage capacitor C1 is equal to the sum of the preset voltage and the data voltage DATA when the third period of time ends.

S140; controlling, during a fourth period of time, the second charging unit 130 to be turned off, such that the energy storage capacitor C1 is discharged to the gate electrode of driving transistor M0, so that the sub-pixels emit light.

The fourth period of time is a continuous period of time, and the fourth period of time follows the third period of time. Generally, no time interval is existed between the fourth period of time and the third period of time, or a short time interval is existed between the fourth period of time and the third period of time. During the fourth period of time, the second charging unit 130 is controlled to be in the off state continuously. At this time, the energy storage capacitor C1 discharges to the gate electrode of the driving transistor M0, and the driving transistor M0 is turned on under the action of the energy storage capacitor C1, to output a driving current to the sub-pixel LED, and to drive the sub-pixel LED to emit light.

In the embodiment 1 of the present application, when the driving transistor M0 is turned on, the voltage output by the energy storage capacitor C1 to the gate electrode of the driving transistor M0 is equal to the sum of the preset voltage and the data voltage DATA. In this way, the voltage output from the energy storage capacitor C1 to the gate electrode of the driving transistor M0 is increased, so that the driving current output by the driving transistor M0 to the sub-pixel LED is increased, and the light-emitting brightness of the sub-pixel LED is improved.

The first specific implementation manner of the pixel driving circuit and the method for pixel driving will be explained in detail below with reference to the accompanying drawings.

Embodiment 2

Figure 2:
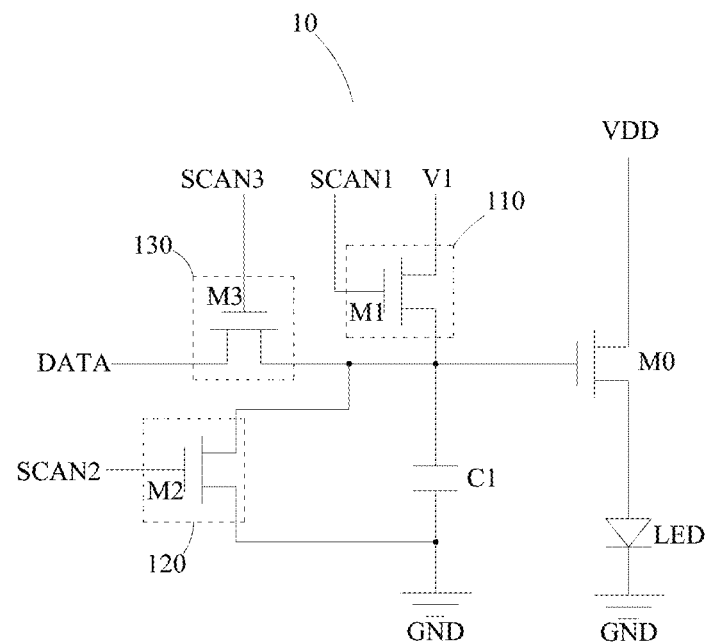
FIG. 2 is a circuit diagram of a first pixel driving circuit provided in an embodiment 2 of the present application.

FIG. 2 is a circuit diagram of a pixel driving circuit 10 provided in the embodiment 2 of the present application. As shown in FIG. 2, the first charging unit 110 includes: a first switching transistor M1. The first electrode of the first switching transistor M1 is configured for inputting the pre-charge voltage V1, and the second electrode of the first switching transistor M1 is connected to the energy storage capacitor C1. That is to say, the first electrode of the first switching transistor M1 constitutes the input terminal a of the first charging unit 110, and the second electrode of the first switching transistor M1 constitutes the output terminal b of the first charging unit 110. The discharging unit 120 includes: a second switching transistor M2. The first electrode of the second switching transistor M2 is connected to the energy storage capacitor C1, and the second electrode of the second switching transistor M2 is configured to connect to the ground GND. That is to say, the first electrode of the second switching transistor M2 constitutes the input terminal c of the discharging unit 120, and the second electrode of the second switching transistor M2 constitutes the output terminal d of the discharging unit 120. The second charging unit 130 includes: a third switching transistor M3. The first electrode of the third switching transistor M3 is configured for inputting the data voltage DATA, and the second electrode of the third switching transistor M3 is connected to the energy storage capacitor C1. That is to say, the first electrode of the third switching transistor M3 constitutes the input terminal e of the second charging unit 130, and the second electrode of the third switching transistor M3 constitutes the output terminal f of the second charging unit 130.

Figure 3:
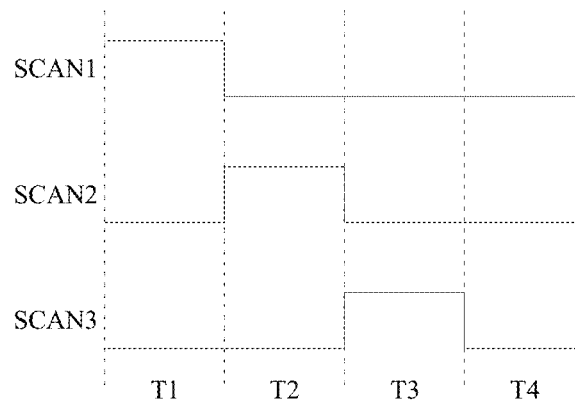
FIG. 3 is a control timing diagram of a pixel driving circuit provided in an embodiment 2 of the present application.

FIG. 3 is a control timing diagram of the pixel driving circuit 10 according to the second embodiment of the present application. As shown in FIG. 3, the method for pixel driving includes the following steps S210 to S240:

S210; outputting, during the first period of time T1, the first scan signal SCAN1 to the gate electrode of the first switching transistor M1, to control the first switching transistor M1 to be turned on.

Step S210 is a specific implementation of step S110 in the embodiment 2. The first switching transistor M1, the second switching transistor M2 and the third switching transistor M3 are all be N-type MOS transistors that are turned on at a high level. That is to say, during the first period of time T1, the first scan signal SCAN1 is output to the gate electrode of the first switching transistor M1. At this time, the first scan signal SCAN1 is at a high level, and the second scan signal SCAN2 and the third scan signal SCAN3 are at a low level, thereby the first switching transistor M1 is controlled to be turned on, and the second switching transistor M2 and the third switching transistor M3 are controlled to be turned off. In this way, the first charging unit 110 is controlled to be turned on within the first period of time T1, thereby charging the energy storage capacitor C1.

S220; stopping, during the second period of time T2, to output the first scan signal SCAN1 to control the first switching transistor M1 to be turned off, and outputting the second scan signal SCAN2 to the gate electrode of the second switching transistor M2 to control the second switching transistor M2 is turned on.

Step S220 is a specific implementation manner of step S120 in the embodiment 2. That is to say, during the second period of time T2, the second scan signal SCAN2 is output to the gate electrode of the second switching transistor M2, at this time the second scan signal SCAN2 is at a high level, the first scan signal SCAN1 and the third scan signal SCAN3 are at a low level, so that the second switching transistor M2 is controlled to be turned on, and the first switching transistor M1 and the third switching transistor M3 are turned off. In this way, the first charging unit 110 can be controlled to be turned off and the discharging unit 120 can be controlled to be turned on within the second period of time T2 to discharge the voltage of the energy storage capacitor C1 to the preset voltage.

In the embodiment 2 of the present application, the second switching transistor M2 has a threshold voltage VTH2. Therefore, after the second period of time T2, that is, after the energy storage capacitor C1 is discharged through the second switching transistor M2, the voltage of the energy storage capacitor C1 is equal to the first threshold voltage VTH2 of the two switching transistors M2. In other words, the preset voltage is the threshold voltage VTH2 of the second switching transistor M2.

S230; stopping, during the third period of time T3, to output the second scan signal SCAN2 to control the second switching transistor M2 to be turned off, and outputting a third scan signal SCAN3 to the gate electrode of the third switching transistor M3 to control the third switching transistor M3 to be turned on;

Step S230 is a specific implementation manner of step S130 in the embodiment 2. That is to say, during the third period of time T3, the third scan signal SCAN3 is output to the gate electrode of the third switching transistor M3. At this time, the third scan signal SCAN3 is at a high level, and the first scan signal SCAN1 and the second scan signal SCAN2 are at a low level, so that the third switching transistor M3 is controlled to be turned on, and the first switching transistor M1 and the second switching transistor M2 are turned off. In this way, during the third period of time T3, the discharging unit 120 is controlled to be turned off, and the second charging unit 130 is controlled to be turned on, so as to charge the energy storage capacitor C1, and the voltage of the energy storage capacitor C1 after the third period of time is the sum of the preset voltage and the data voltage DATA. That is to say, the voltage of the energy storage capacitor C1 is the sum of the threshold voltage VTH2 of the second switching transistor M2 and the data voltage DATA after the third period of time.

S240; stopping, during the fourth period of time T4, to output the third scan signal SCAN3 to control the third switching transistor M3 to be turned off.

Step S240 is a specific implementation of step S140 in the embodiment 2. That is to say, during the fourth period of time T4, the first scan signal SCAN1, the second scan signal SCAN2, and the third scan signal SCAN3 are all low level signals, thereby controlling the first switching transistor M1, the second switching transistor M2, and the third switching transistors M3 are all turned off. In this way, during the fourth period of time T4, the second charging unit 130 is controlled to be turned off, so that the energy storage capacitor C1 discharges to the gate electrode of the driving transistor M0, so that the sub-pixel LED emits light.

In the embodiment 2 of the present application, after the second period of time T2, the voltage of the energy storage capacitor C1 is equal to the threshold voltage VTH2 of the second switching transistor M2. Since the driving transistor M0 also has a threshold voltage VTH0, when the driving transistor M0 is turned on, the operating current of the sub-pixel LED is:

$$I = K(V_{TH2} + V_{DATA} - V_{TH0} - V_{LED})$$

$V_{TH2}$ is the value of the threshold voltage VTH2 of the second switching transistor M2; $V_{DATA}$ is the value of the data voltage DATA; $V_{TH0}$ is the value of the threshold voltage VTH0 of the driving transistor M0; $V_{LED}$ is the voltage value of the sub-pixel LED; and K is the structural parameter of the driving transistor M0.

Generally, the difference in threshold voltages of different transistors is small. That is to say, the value $V_{TH2}$ of the threshold voltage VTH2 of the second switching transistor M2 is approximately equal to the value $V_{TH0}$ of the threshold voltage VTH0 of the driving transistor M0, so that not only the driving current output from the driving transistor M0 to the sub-pixel LED is increased, but also the light-emitting brightness of the sub-pixel LED is improved. At the same time, according to the above formula, after the value $V_{TH2}$ of the threshold voltage VTH2 of the second switching transistor M2 cancels the value $V_{TH0}$ of the threshold voltage VTH0 of the driving transistor M0, the influence of the threshold voltage VTH0 of the driving transistor M0 on the operating current of the sub-pixel LED can also be reduced, thereby improving the brightness uniformity of the display panel to which the pixel driving circuit 10 is applied.

Figure 4:
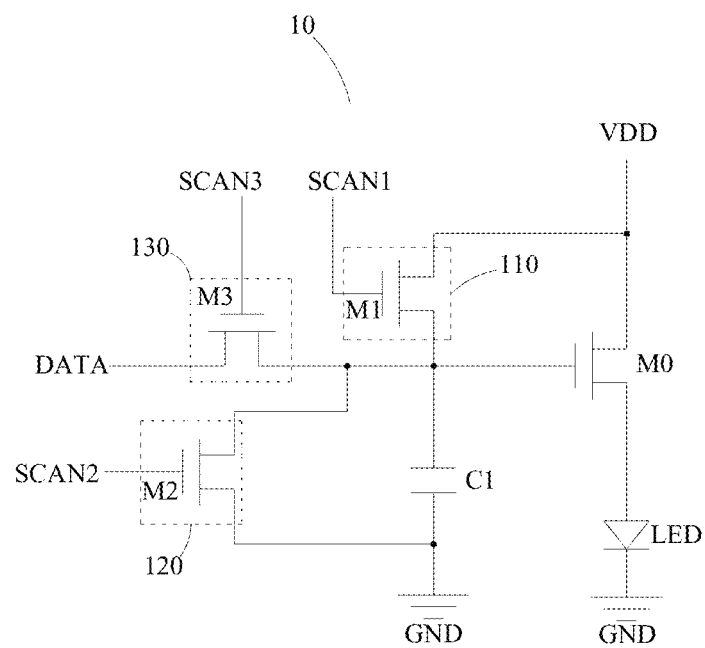
FIG. 4 is a circuit diagram of a second type of pixel driving circuit provided in an embodiment 2 of the present application.

In some embodiments, the pre-charge voltage V1 is the power supply voltage VDD. In this case, the circuit diagram of the pixel driving circuit 10 is shown in FIG. 4, that is, the first electrode of the first switching transistor M1 and the first electrode of the driving transistor M0 are connected, so that when the first switching transistor M1 is turned on, the power supply voltage VDD charges the energy storage capacitor C1 through the first switching transistor M1. When the first period of time T1 ends, the voltage of the energy storage capacitor C1 is equal to the power supply voltage VDD.

In other embodiments, the pre-charge voltage V1 is the data voltage DATA. In this time, the first electrode of the first switching transistor M1 is connected to the first electrode of the third switching transistor M3, so that when the first switching transistor M1 is turned on, the data voltage DATA charges the energy storage capacitor C1 through the first switching transistor M1, and when the first period of time T1 ends, the voltage of the energy storage capacitor C1 is equal to the data voltage DATA.

The second specific implementation manner of the pixel driving circuit 10 and the method for pixel driving will be explained in detail below with reference to the accompanying drawings.

Embodiment 3

Figure 5:
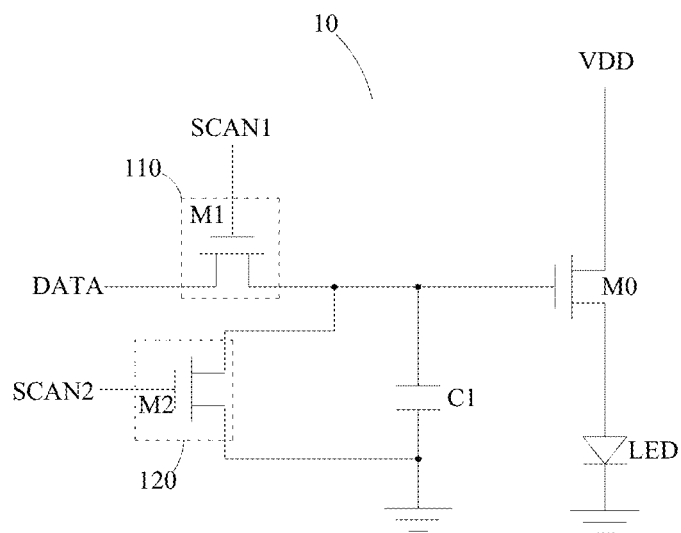
FIG. 5 is a circuit diagram of a pixel driving circuit provided in an embodiment 3 of the present application.

FIG. 5 is a circuit diagram of the pixel driving circuit 10 provided in Embodiment 3 of the present application. As shown in FIG. 5, the first charging unit 110 includes: a first switching transistor M1. The first electrode of the first switching transistor M1 is configured to input the pre-charge voltage V1, the pre-charge voltage V1 is the data voltage DATA, and the second electrode of the first switching transistor M1 is connected to the energy storage capacitor C1. That is to say, the first electrode of the first switching transistor M1 constitutes the input terminal a of the first charging unit 110, and the second electrode of the first switching transistor M1 constitutes the output terminal b of the first charging unit 110. The discharging unit 120 includes a second switching transistor M2. The first electrode of the second switching transistor M2 is connected to the energy storage capacitor C1, and the second electrode of the second switching transistor M2 is configured to connect to the ground GND. That is to say, the first electrode of the second switching transistor M2 constitutes the input terminal c of the discharging unit 120, and the second electrode of the second switching transistor M2 constitutes the output terminal d of the discharging unit 120. The second charging unit 130 multiplexes the first switching transistor M1. That is to say, the first electrode of the first switching transistor M1 also constitutes the input terminal e of the second charging unit 130, and the second electrode of the first switching transistor M1 also constitutes the output terminal f of the second charging unit 130.

Figure 6:
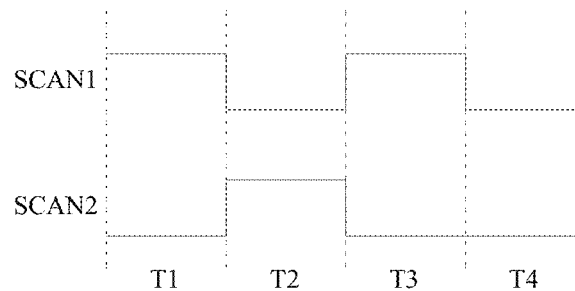
FIG. 6 is a control timing diagram of a pixel driving circuit provided in an embodiment 3 of the present application.

FIG. 6 is a control timing diagram of the pixel driving circuit 10 provided in the embodiment 3 of the present application. As shown in FIG. 6, the method for pixel driving includes the following steps S310 to S340:

S310; outputting, during the first period of time T1, the first scan signal SCAN1 to the gate electrode of the first switching transistor M1, to control the first switching transistor M1 to be turned on.

Step S310 is a specific implementation of step S110 in the embodiment 3. Both the first switching transistor M1 and the second switching transistor M2 are N-type MOS transistors that are turned on at a high level. That is to say, during the first period of time T1, the first scan signal SCAN1 is output to the gate electrode of the first switching transistor M1. At this time, the first scan signal SCAN1 is at a high level, and the second scan signal SCAN2 is at a low level. Thus, the first switching transistor M1 is controlled to be turned on, and the second switching transistor M2 is turned off. In this way, the first charging unit 110 is controlled to be turned on within the first period of time T1, thereby charging the energy storage capacitor C1. In this step, the pre-charge voltage V1 charged to the energy storage capacitor C1 is the data voltage DATA.

S320; stopping, during the second period of time T2, to output the first scan signal SCAN1 to control the first switching transistor M1 to be turned off, and outputting the second scan signal SCAN2 to the gate electrode of the second switching transistor M2 to control the second switching transistor M2 is turned on.

Step S320 is a specific implementation of step S120 in the embodiment 3. That is to say, during the second period of time T2, the second scan signal SCAN2 is output to the gate electrode of the second switching transistor M2, at this time, the second scan signal SCAN2 is at a high level, and the first scan signal SCAN1 is at a low level, Thus, the second switching transistor M2 is controlled to be turned on, and the first switching transistor M1 is turned off. In this way, the first charging unit 110 can be controlled to be turned off and the discharging unit 120 can be controlled to be turned on within the second period of time T2, to discharge the voltage of the energy storage capacitor C1 to the preset voltage.

In the embodiment 3 of the present application, the second switching transistor M2 has a threshold voltage VTH2. Therefore, after the second period of time T2, that is, after the energy storage capacitor C1 is discharged through the second switching transistor M2, the voltage of the energy storage capacitor C1 is equal to the first threshold voltage VTH2 of the two switching transistors M2. In other words, the preset voltage is the threshold voltage VTH2 of the second switching transistor M2.

S330; stopping, during the third period of time T3, to output the second scan signal SCAN2 to control the second switching transistor M2 to be turned off, and outputting the first scan signal SCAN1 to the gate electrode of the first switching transistor M1 to control the first switching transistor M1 is turned on.

Step S330 is a specific implementation of step S130 in the embodiment 3. That is to say, during the third period of time T3, the first scan signal SCAN1 is output to the gate electrode of the first switching transistor M1. At this time, the first scan signal SCAN1 is at a high level, and the second scan signal SCAN2 is at a low level. Thus, the first switching transistor M1 is controlled to be turned on, and the second switching transistor M2 is turned off. In this way, during the third period of time T3, the discharging unit 120 is controlled to be turned off, and the second charging unit 130 that multiplexes the first switching transistor M1 is controlled to be turned on, so as to charge the energy storage capacitor C1, and the voltage of the energy storage capacitor C1 is the sum of the preset voltage and the data voltage DATA after the third period of time. That is to say, the voltage of the energy storage capacitor C1 is the sum of the threshold voltage VTH2 of the second switching transistor M2 and the data voltage DATA after the third period of time.

S340; stopping, during the fourth period of time T4, to output the first scan signal SCAN1 to control the first switching transistor M1 to be turned off.

Step S340 is a specific implementation of step S140 in the embodiment 3. That is to say, during the fourth period of time T4, both the first scan signal SCAN1 and the second scan signal SCAN2 are at a low level signal, so that both the first switching transistor M1 and the second switching transistor M2 are controlled to be turned off. In this way, during the fourth period of time T4, the second charging unit 130 that multiplexes the first switching transistor M1 can be controlled to be turned off, so that the energy storage capacitor C1 discharges to the gate electrode of the driving transistor M0, so that the sub-pixel LED emits light.

In the embodiment 3 of the present application, when the sub-pixel LED emits light, the magnitude of the working current is the same as that of the embodiment 2. That is to say, the pixel driving circuit 10 and the method for pixel driving in the embodiment 3 of the present application can not only increase the driving current output by the driving transistor M0 to the sub-pixel LED, but also improve the light-emitting brightness of the sub-pixel LED; at the same time, the influence of the threshold voltage VTH0 of the driving transistor M0 on the operating current of the sub-pixel LED can also be reduced, thereby improving the brightness uniformity of the display panel to which the pixel driving circuit 10 is applied.

The third specific implementation manner of the pixel driving circuit 10 and the method for pixel driving will be explained in detail below with reference to the accompanying drawings.

Embodiment 4

Figure 7:
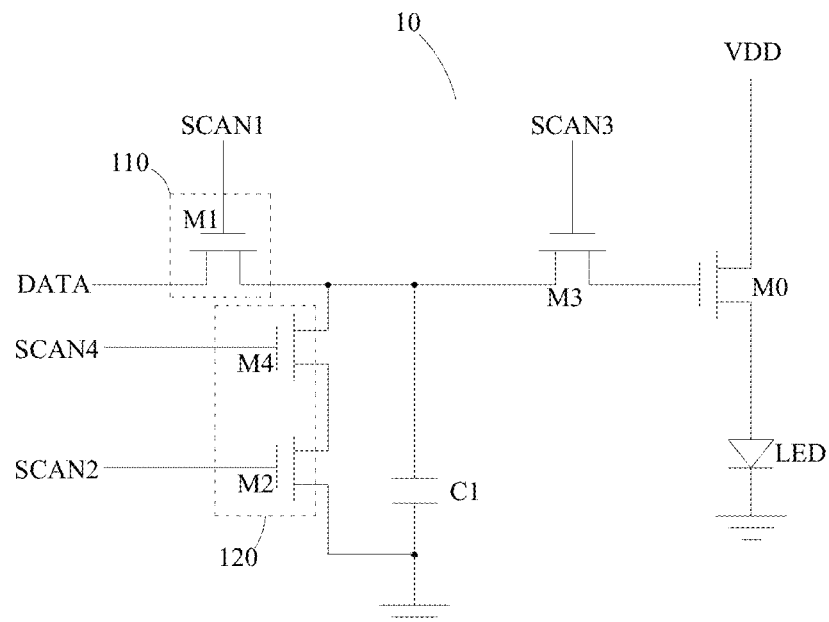
FIG. 7 is a circuit diagram of a first pixel driving circuit provided in an embodiment 4 of the present application.

FIG. 7 is a circuit diagram of a pixel driving circuit 10 provided in the embodiment 4 of the present application. As shown in FIG. 7, the pixel driving circuit 10 provided by the embodiment 4 of the present application, on the basis of the pixel driving circuit 10 provided by the embodiment 3 of the present application, further includes: a third switching transistor M3. The first electrode of the third switching transistor M3 is connected to the energy storage capacitor C1, and the second electrode of the third switching transistor M3 is connected to the gate electrode of the driving transistor M0. Based on this, the discharging unit 120 further includes: a fourth switching transistor M4. The first electrode of the fourth switching transistor M4 is connected to the energy storage capacitor C1, and the second electrode of the fourth switching transistor M4 is connected to the first electrode of the second switching transistor M2. At this time, the first electrode of the fourth switching transistor M4 constitutes the input terminal c of the discharging unit 120, and the second electrode of the second switching transistor M2 constitutes the output terminal d of the discharging unit 120.

Figure 8:
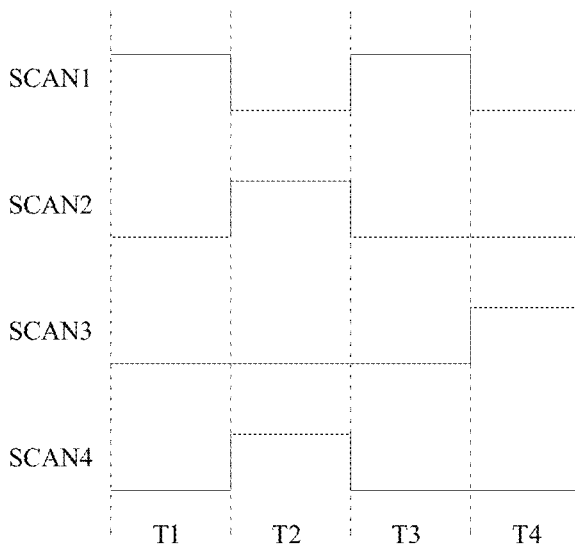
FIG. 8 is a control timing diagram of a first pixel driving circuit provided in an embodiment 4 of the present application.

FIG. 8 is a control timing diagram of a pixel driving circuit 10 provided in the embodiment 4 of the present application. As shown in FIG. 8, on the basis of the above steps S310 to S340, the method for pixel driving further includes the following steps S420 and S440:

S420; outputting, during the second period of time T2, a fourth scan signal SCAN4 to the gate electrode of the fourth switching transistor M4, to control the fourth switching transistor M4 to be turned on.

Step S420 is performed synchronously with the step S320. That is to say, during the second period of time T2, the second scan signal SCAN2 is output to the gate electrode of the second switching transistor M2, and the fourth scan signal SCAN4 is output to the gate electrode of the fourth switching transistor M4. At this time, the second scan signal SCAN2 and the fourth scan signal SCAN4 are at a high level, and the first scan signal SCAN1 and the third scan signal SCAN3 are at a low level, thereby controlling the second switching transistor M2 and the fourth switching transistor M4 to be turned on, and the first switching transistor M1 and the third switching transistor M3 to be turned off. In this way, the first charging unit 110 is controlled to be turned off and the discharging unit 120 is controlled to be turned on within the second period of time T2 to discharge the voltage of the energy storage capacitor C1 to the preset voltage.

In the embodiment 4 of the present application, the second switching transistor M2 has a threshold voltage VTH2, and the fourth switching transistor M4 has a threshold voltage VTH4. Therefore, after the second period of time T2, that is, after the energy storage capacitor C1 is discharged through the fourth switching transistor M4 and the second switching transistor M2, the voltage of the energy storage capacitor C1 is equal to the sum of the threshold voltage VTH2 of the second switching transistor M2 and the threshold voltage VTH4 of the fourth switching transistor M4. In other words, the preset voltage is the sum of the threshold voltage VTH2 of the second switching transistor M2 and the threshold voltage VTH4 of the fourth switching transistor M4.

S440; outputting, during the fourth period of time T4, the third scan signal SCAN3 to the gate electrode of the third switching transistor M3, to control the third switching transistor M3 to be turned on.

Step S440 is performed synchronously with the step S340. That is to say, during the fourth period of time T4, the third scan signal SCAN3 is output to the gate electrode of the third switching transistor M3, at this time, the third scan signal SCAN3 is a high level signal, the first scan signal SCAN1, the second scan signal SCAN2, and the fourth scan signal SCAN4 are both low level signals, thereby controlling the third switching transistor M3 to be turned on, and controlling the first switching transistor M1, the second switching transistor M2, and the fourth switching transistor M4 to be turned off. In this way, the energy storage capacitor C1 is discharged to the gate electrode of the driving transistor M0 during the fourth period of time T4, so that the sub-pixel LED emits light.

In the embodiment 4 of the present application, after the second period of time T2, the voltage of the energy storage capacitor C1 is equal to the sum of the threshold voltage VTH2 of the second switching transistor M2 and the threshold voltage VTH4 of the fourth switching transistor M4.

Since the driving transistor M0 also has a threshold voltage VTH0, and the third switching transistor M3 also has a threshold voltage VTH3, when the third switching transistor M3 and the driving transistor M0 are turned on, the operating current of the sub-pixel LED is:

$$I = K(V_{TH2} + V_{TH4} + V_{DATA} - V_{TH3} - V_{TH0} - V_{LED})$$

$V_{TH2}$ is the value of the threshold voltage VTH2 of the second switching transistor M2; $V_{TH4}$ is the value of the threshold voltage VTH4 of the fourth switching transistor M4; $V_{DATA}$ is the value of the data voltage DATA; $V_{TH3}$ is the value of the threshold voltage VTH3 of the third switching transistor M3; $V_{TH0}$ is the value of the threshold voltage VTH0 of the transistor M0; $V_{LED}$ is the voltage value of the sub-pixel LED; K is the structural parameter of the driving transistor M0.

Generally, the difference in threshold voltages of different transistors is small. In this way, not only the driving current output from the driving transistor M0 to the sub-pixel LED is improved, but also the light-emitting brightness of the sub-pixel LED is improved; at the same time, according to the above formula, after the value $V_{TH2}$ of the threshold voltage VTH2 of the second switching transistor M2 and the value $V_{TH4}$ of the threshold voltage VTH4 of the fourth switching transistor M4 counteracts the value $V_{TH0}$ of the threshold voltage VTH0 of the driving transistor M0 and the value $V_{TH3}$ of the threshold voltage VTH3 of the third switching transistor M3, the influence of the threshold voltage VTH0 of the driving transistor M0 on the operating current of the sub-pixel LED is reduced. Therefore, the brightness uniformity of the display panel to which the pixel driving circuit 10 is applied is improved.

Figure 9:
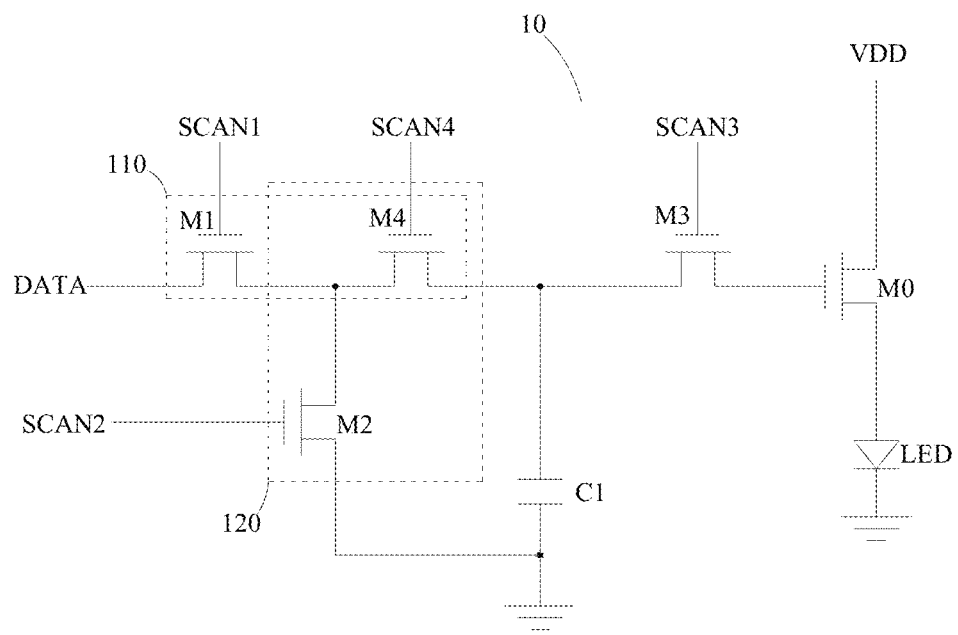
FIG. 9 is a circuit diagram of a second pixel driving circuit provided in an embodiment 4 of the present application.

FIG. 9 is a circuit diagram of another pixel driving circuit 10 provided in the embodiment 4 of the present application. The pixel driving circuit 10 shown in FIG. 9 is obtained by a modification of the embodiment shown in FIG. 7. As shown in FIG. 9, on the basis of the embodiment shown in FIG. 7, the pixel driving circuit 10 makes the first charging unit 110 multiplexes the fourth switching transistor M4. That is, the discharging unit 120 includes: the second switching transistor M2 and the fourth switching transistor M4; the first charging unit 110 includes: the first switching transistor M1 and the fourth switching transistor M4; the second charging unit 130 multiplexes the first charging unit 110. That is, the second charging unit 130 further includes: the first switching transistor M1 and the fourth switching transistor M4. At this time, the first electrode of the fourth switching transistor M4 constitutes the input terminal c of the discharging unit 120, and further constitutes the output terminal b of the first charging unit 110 and the output terminal f of the second charging unit 130.

Figure 10:
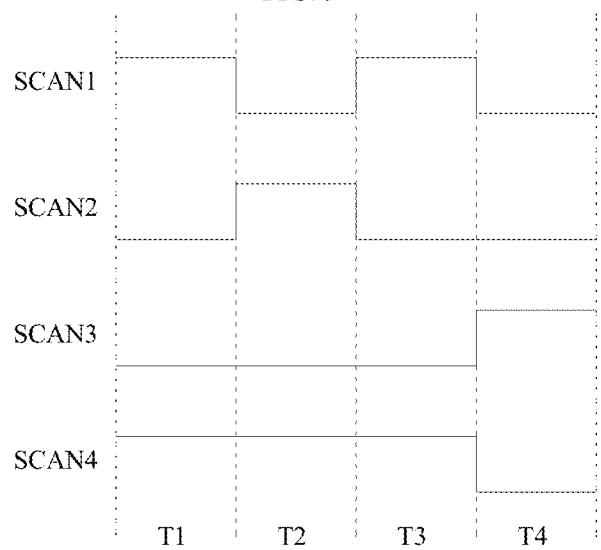
FIG. 10 is a control timing diagram of a second type of pixel driving circuit provided in an embodiment 4 of the present application.

FIG. 10 is a timing control diagram of another pixel driving circuit 10 provided in the embodiment 4 of the present application. As shown in FIG. 10, the difference between the method for pixel driving and the embodiment shown in FIG. 8 is that: during the first period of time T1 and the third period of time T3, a fourth scan signal SCAN4 is output to the gate electrode of the fourth switching transistor M4 to control the fourth switching transistor M4 to be turned on.

Specifically, the method for pixel driving includes the following steps:

S510; outputting, during the first period of time T1, the first scan signal SCAN1 to the gate electrode of the first switching transistor M1 to control the first switching transistor M1 to be turned on; and outputting the fourth scan signal SCAN4 to the gate electrode of the fourth switching transistor M4, to control the fourth switching transistor M4 to be turned on.

Step S510 is a specific implementation of the step S110. The first switching transistor M1, the second switching transistor M2, the third switching transistor M3, and the fourth switching transistor M4 are all N-type MOS transistors that are turned on at a high level. That is to say, during the first period of time T1, the first scan signal SCAN1 and the fourth scan signal SCAN4 are at a high level, and the second scan signal SCAN2 and the third scan signal SCAN3 are at a low level, thereby controlling the first switching transistor M1 and the fourth switching transistor M4 to be turned on, and the second switching transistor M2 and the third switching transistor M3 to be turned off. In this way, the first charging unit 110 is controlled to be turned on within the first period of time T1, thereby charging the energy storage capacitor C1. In this step, the pre-charge voltage V1 charged to the energy storage capacitor C1 is the data voltage DATA.

S520; stopping, during the second period of time T2, to output the first scan signal SCAN1 to control the first switching transistor M1 to be turned off, and outputting the second scan signal SCAN2 to the gate electrode of the second switching transistor M2 to control the second switching transistor M2 is turned on, and outputting a fourth scan signal SCAN4 to the gate electrode of the fourth switching transistor M4 to control the fourth switching transistor M4 to be turned on.

Step S520 is a specific implementation of the step S120. That is, during the second period of time T2, the second scan signal SCAN2 is output to the gate electrode of the second switching transistor M2, and the fourth scan signal SCAN4 is output to the gate electrode of the fourth switching transistor M4. At this time, the second scan signal SCAN2 and the fourth scan signal SCAN4 are at a high level, and the first scan signal SCAN1 and the third scan signal SCAN3 are at a low level, so that the second switching transistor M2 and the fourth switching transistor M4 are controlled to be turned on, the first switching transistor M1 and the third switching transistor M3 are controlled to be turned off. In this way, the first charging unit 110 is controlled to be turned off and the discharging unit 120 is controlled to be turned on within the second period of time T2 to discharge the voltage of the energy storage capacitor C1 to the preset voltage. The preset voltage here is the sum of the threshold voltage VTH2 of the second switching transistor M2 and the threshold voltage VTH4 of the fourth switching transistor M4.

S530; stopping, during the third period of time T3, to output the second scan signal SCAN2 to control the second switching transistor M2 to be turned off, and outputting the first scan signal SCAN1 to the gate electrode of the first switching transistor M1 to control the first switching transistor M1 is turned on, and outputting a fourth scan signal SCAN4 to the gate electrode of the fourth switching transistor M4 to control the fourth switching transistor M4 to be turned on.

Step S530 is a specific implementation of the step S130. That is to say, during the third period of time T3, the first scan signal SCAN1 is output to the gate electrode of the first switching transistor M1, and the fourth scan signal SCAN4 is output to the gate electrode of the fourth switching transistor M4. At this time, the first scan signal SCAN1 and the fourth scan signal SCAN4 are at a high level, and the second scan signal SCAN2 and the third scan signal SCAN3 are at a low level, so that the first switching transistor M1 and the fourth switching transistor M4 are controlled to be turned on, and the second switching transistor M2 and the third switching transistor M3 are controlled to be turned off. In this way, during the third period of time T3, the discharging unit 120 is controlled to be turned off, and the second charging unit 130 is controlled to multiplex the first charging unit 110 to charge the energy storage capacitor C1. The voltage of the energy storage capacitor C1 is the sum of the preset voltage and the data voltage DATA after the third period of time.

S540, stopping, during the fourth period of time T4, to output the first scan signal SCAN1 to control the first switching transistor M1 to be turned off; and stopping to output the fourth scan signal SCAN4 to control the fourth switching transistor M4 to be turned off.

Step S540 is a specific implementation of the step S140. That is to say, during the fourth period of time T4, the first scan signal SCAN1, the second scan signal SCAN2 and the fourth scan signal SCAN4 are all low level signals, thereby controlling the first switching transistor M1, the second switching transistor M2, and the fourth switching transistors M4 to be turned off; the third scan signal SCAN3 is at a high level, thereby controlling the third switching transistor M3 to be turned on. In this way, the second charging unit 130 that multiplexes the first charging unit 110 can be controlled to turn off during the fourth period of time T4, so that the energy storage capacitor C1 discharges to the gate electrode of the driving transistor M0, so that the sub-pixel LED emits light.

Embodiment 5

An embodiment of the present application further provides a display panel, which includes: sub-pixels and a pixel driving circuit as in any one of the foregoing embodiments. The pixel driving circuit includes: a first charging unit, a discharging unit, a second charging unit, an energy storage capacitor and a driving transistor. The input terminal of the first charging unit is configured for inputting the pre-charge voltage, and the output terminal of the first charging unit is connected to the energy storage capacitor, so as to charge the energy storage capacitor when the first charging unit is turned on. The first terminal of the discharging unit is connected to the energy storage capacitor, and the second terminal of the discharging unit is connected to the ground, so as to discharge the voltage of the energy storage capacitor to a preset voltage when the discharging unit is turned on. The input terminal of the second charging unit is configured for inputting the data voltage, and the output terminal of the second charging unit is connected to the energy storage capacitor, so as to charge the energy storage capacitor when the second charging unit is turned on. The first electrode of the driving transistor is configured to input the power supply voltage, the second electrode of the driving transistor is connected to the sub-pixels, and the gate electrode of the driving transistor is connected to the energy storage capacitor, so that when the energy storage capacitor discharges to the gate electrode of the driving transistor, the sub-pixels emit light.

In some embodiments, the first charging unit includes: a first switching transistor; the discharging unit includes: a second switching transistor; and the second charging unit includes: a third switching transistor.

The first electrode of the first switching transistor is configured for inputting the pre-charge voltage, and the second electrode of the first switching transistor is connected to the energy storage capacitor. The first electrode of the second switching transistor is connected to the energy storage capacitor, and the second electrode of the second switching transistor is configured to connect to the ground. The first electrode of the third switching transistor is configured for inputting the data voltage, and the second electrode of the third switching transistor is connected to the energy storage capacitor.

In some embodiments, the first electrode of the first switching transistor is connected to the first electrode of the driving transistor, and the pre-charge voltage is the power supply voltage.

In some embodiments, the first charging unit includes: a first switching transistor; the discharging unit includes: a second switching transistor; the second charging unit multiplexes the first switching transistor, and the pre-charge voltage is the data voltage.

The first electrode of the first switching transistor is configured for inputting the data voltage, and the second electrode of the first switching transistor is connected to the energy storage capacitor. The first electrode of the second switching transistor is connected to the energy storage capacitor, and the second electrode of the second switching transistor is configured to connect to the ground.

In some embodiments, the pixel driving circuit further includes: a third switching transistor. The first electrode of the third switching transistor is connected to the energy storage capacitor, and the second electrode of the third switching transistor is connected to the gate electrode of the driving transistor. The discharging unit further includes: a fourth switching transistor. The first electrode of the fourth switching transistor is connected to the energy storage capacitor, and the second electrode of the fourth switching transistor is connected to the first electrode of the second switching transistor.

In the embodiment of the present application, the first charging unit is configured to pre-charge the energy storage capacitor. The discharging unit is configured for discharging the voltage of the pre-charged energy storage capacitor to a preset voltage. The second charging unit is configured for inputting the data voltage to the energy storage capacitor after the energy storage capacitor is discharged through the discharging unit. After the second charging unit charges the energy storage capacitor, the voltage of the energy storage capacitor is equal to the sum of the preset voltage and the data voltage. The energy storage capacitor is connected to the gate electrode of the driving transistor, that is, when the driving transistor is turned on, the voltage output by the energy storage capacitor to the gate electrode of the driving transistor is equal to the sum of the preset voltage and the data voltage. In this way, the voltage output from the energy storage capacitor to the gate electrode of the driving transistor is increased, so that the driving current output by the driving transistor to the sub-pixels can be increased, and the light-emitting brightness of the sub-pixels is improved.

Embodiment 6

An embodiment of the present application further provides a display device, which includes: the display panel and the timing controller as in the embodiment 5. The timing controller is connected to the pixel driving circuit in the display panel, and is configured for executing the method for pixel driving in any one of the above embodiments.

In an embodiment, the method for pixel driving includes: controlling, during a first period of time, the first charging unit to be turned on to charge the energy storage capacitor; controlling, during a second period of time, the first charging unit to be turned off and the discharging unit to be turned on, to discharge a voltage of the energy storage capacitor to a preset voltage; controlling, during a third period of time, the discharging unit to be turned off and the second charging unit to be turned on, to charge the energy storage capacitor, wherein the voltage of the energy storage capacitor is a sum of the preset voltage and the data voltage after the third period of time; and controlling, during a fourth period of time, the second charging unit to be turned off, such that the energy storage capacitor is discharged to the gate electrode of driving transistor, so that the sub-pixels emit light.

In some embodiments, the first charging unit includes: a first switching transistor; the discharging unit includes: a second switching transistor; and the second charging unit includes: a third switching transistor. The step of during the first period of time, controlling the first charging unit to be turned on includes: during the first period of time, outputting a first scan signal to the gate electrode of the first switching transistor to control the first switching transistor to be turned on. The step of during the second period of time, controlling the first charging unit to be turned off and the discharging unit to be turned on include: during the second period of time, stopping to output the first scan signal to control the first switching transistor to be turned off, and outputting a second scan signal to the gate electrode of the second switching transistor to control the second switching transistor to be turned on. The step of during the third period of time, controlling the discharging unit to be turned off, and controlling the second charging unit to be turned on, includes: during the third period of time, stopping to output the second scan signal to control the second switching transistor to be turned off, and outputting a third scan signal to the gate electrode of the third switching transistor to control the third switching transistor to be turned on. The step of during the fourth period of time, controlling the second charging unit to be turned off includes: during the fourth period of time, stopping outputting the third scan signal, to control the third switching transistor to be turned off.

In some embodiments, the first charging unit includes: a first switching transistor; the discharging unit includes: a second switching transistor; the second charging unit multiplexes the first switching transistor, and the pre-charge voltage is a data voltage.

The step of controlling, during a first period of time, the first charging unit to be turned on to charge the energy storage capacitor includes: outputting, during the first period of time, a first scan signal to the gate electrode of the first switching transistor to control the first switching transistor to be turned on. The step of controlling, during a second period of time, the first charging unit to be turned off and the discharging unit to be turned on includes: stopping, during the second period of time, to output the first scan signal to control the first switching transistor to be turned off, and outputting a second scan signal to the gate electrode of the second switching transistor to control the second switching transistor to be turned on. The step of controlling, during a third period of time, the discharging unit to be turned off and the second charging unit to be turned on includes: stopping, during the third period of time, to output the second scan signal to control the second switching transistor to be turned off, and outputting the first scan signal to the gate electrode of the first switching transistor to control the first switching transistor to be turned on. The step of controlling, during the fourth period of time, the second charging unit to be turned off includes: stopping, during the fourth period of time, to output the first scan signal to control the first switching transistor to be turned off.

In some embodiments, the pixel driving circuit further includes: a third switching transistor. A first electrode of the third switching transistor is connected to the energy storage capacitor, and a second electrode of the third switching transistor is connected to a gate electrode of the driving transistor. The discharging unit further includes: a fourth switching transistor. A first electrode of the fourth switching transistor is connected to the energy storage capacitor, and a second electrode of the fourth switching transistor is connected to the first electrode of the second switching transistor The method for pixel driving further includes: outputting, during the second period of time, a fourth scan signal to the gate electrode of the fourth switching transistor to control the fourth switching transistor to be turned on; and outputting, during the fourth period of time, a third scan signal to the gate electrode of the third switching transistor to control the third switching transistor to be turned on.

In the embodiment of the present application, the first charging unit is configured to pre-charge the energy storage capacitor. The discharging unit is configured for discharging the voltage of the pre-charged energy storage capacitor to a preset voltage. The second charging unit is configured for inputting the data voltage to the energy storage capacitor after the energy storage capacitor is discharged through the discharging unit. After the second charging unit charges the energy storage capacitor, the voltage of the energy storage capacitor is equal to the sum of the preset voltage and the data voltage. The energy storage capacitor is connected to the gate electrode of the driving transistor, that is, when the driving transistor is turned on, the voltage output by the energy storage capacitor to the gate electrode of the driving transistor is equal to the sum of the preset voltage and the data voltage. In this way, the voltage output from the energy storage capacitor to the gate electrode of the driving transistor is increased, so that the driving current output by the driving transistor to the sub-pixels can be increased, and the light-emitting brightness of the sub-pixels is improved.

As stated above, the aforesaid embodiments are only intended to explain but not to limit the technical solutions of the present application. Although the present application has been explained in detail with reference to the above-described embodiments, it should be understood for the ordinary skilled one in the art that, the technical solutions described in each of the above-described embodiments can still be amended, or some technical features in the technical solutions can be replaced equivalently; these amendments or equivalent replacements, which won't make the essence of corresponding technical solution to be broken away from the spirit and the scope of the technical solution in various embodiments of the present application, should all be included in the protection scope of the present application.

What is claimed is:

1. A pixel driving circuit for driving sub-pixels to emit light, comprising:
   a first charging unit, wherein an input terminal of the first charging unit is configured for inputting a pre-charge voltage, and an output terminal of the first charging unit is connected to an energy storage capacitor, so as to charge the energy storage capacitor when the first charging unit is turned on;
   a discharging unit, wherein a first terminal of the discharging unit is connected to the energy storage capacitor, and a second terminal of the discharging unit is connected to a ground, so as to discharge a voltage of the energy storage capacitor to a preset voltage when the discharging unit is turned on;
   a second charging unit, wherein an input terminal of the second charging unit is configured for inputting a data voltage, and an output terminal of the second charging unit is connected to the energy storage capacitor, so as to charge the energy storage capacitor when the second charging unit is turned on; and
   a driving transistor, wherein a first electrode of the driving transistor is configured for inputting a power supply voltage, a second electrode of the driving transistor is configured for connecting with the sub-pixels, and a gate electrode of the driving transistor is connected to the energy storage capacitor, so as to emit light through the sub-pixels when the energy storage capacitor discharges the gate electrode of the driving transistor.

2. The pixel driving circuit according to claim 1, wherein the first charging unit comprises a first switching transistor, the discharging unit comprises a second switching transistor, and the second charging unit comprises a third switching transistor;
   a first electrode of the first switching transistor is configured for inputting the pre-charge voltage, and a second electrode of the first switching transistor is connected to the energy storage capacitor;
   a first electrode of the second switching transistor is connected to the energy storage capacitor, and a second electrode of the second switching transistor is configured for connecting to the ground; and
   a first electrode of the third switching transistor is configured for inputting the data voltage, and a second electrode of the third switching transistor is connected to the energy storage capacitor.

3. The pixel driving circuit according to claim 2, wherein the first electrode of the first switching transistor is connected to the first electrode of the driving transistor, and the pre-charge voltage is the power supply voltage.

4. The pixel driving circuit according to claim 1, wherein the first charging unit comprises a first switching transistor, the discharging unit comprises a second switching transistor, and the second charging unit multiplexes the first switching transistor, and the pre-charge voltage is the data voltage;
   a first electrode of the first switching transistor is configured for inputting the data voltage, and a second electrode of the first switching transistor is connected to the energy storage capacitor; and
   a first electrode of the second switching transistor is connected to the energy storage capacitor, and a second electrode of the second switching transistor is configured for connecting to the ground.

5. The pixel driving circuit according to claim 4, further comprising:
   a third switching transistor, wherein a first electrode of the third switching transistor is connected to the energy storage capacitor, and a second electrode of the third switching transistor is connected to a gate electrode of the driving transistor;
   wherein the discharging unit further comprises:
   a fourth switching transistor, a first electrode of the fourth switching transistor is connected to the energy storage capacitor, and a second electrode of the fourth switching transistor is connected to the first electrode of the second switching transistor.

6. A method for pixel driving, applied to a pixel driving circuit comprising:
- a first charging unit, wherein an input terminal of the first charging unit is configured for inputting a pre-charge voltage, and an output terminal of the first charging unit is connected to an energy storage capacitor, so as to charge the energy storage capacitor when the first charging unit is turned on;
- a discharging unit, wherein a first terminal of the discharging unit is connected to the energy storage capacitor, and a second terminal of the discharging unit is connected to a ground, so as to discharge a voltage of the energy storage capacitor to a preset voltage when the discharging unit is turned on;
- a second charging unit, wherein an input terminal of the second charging unit is configured for inputting a data voltage, and an output terminal of the second charging unit is connected to the energy storage capacitor, so as to charge the energy storage capacitor when the second charging unit is turned on; and
- a driving transistor, wherein a first electrode of the driving transistor is configured for inputting a power supply voltage, a second electrode of the driving transistor is configured for connecting with the sub-pixels, and a gate electrode of the driving transistor is connected to the energy storage capacitor, so as to emit light through the sub-pixels when the energy storage capacitor discharges the gate electrode of the driving transistor; and the method comprises:
- controlling, during a first period of time, the first charging unit to be turned on to charge the energy storage capacitor;
- controlling, during a second period of time, the first charging unit to be turned off and the discharging unit to be turned on, to discharge a voltage of the energy storage capacitor to a preset voltage;
- controlling, during a third period of time, the discharging unit to be turned off and the second charging unit to be turned on, to charge the energy storage capacitor, wherein the voltage of the energy storage capacitor is a sum of the preset voltage and the data voltage after the third period of time; and
- controlling, during a fourth period of time, the second charging unit to be turned off, such that the energy storage capacitor is discharged to the gate electrode of driving transistor, so that the sub-pixels emit light.

7. The method for pixel driving according to claim 6, wherein the first charging unit comprises a first switching transistor, the discharging unit comprises a second switching transistor, and the second charging unit comprises a third switching transistor;
- the step of controlling, during a first period of time, the first charging unit to be turned on comprises:
- outputting, during the first period of time, a first scan signal to the gate electrode of the first switching transistor to control the first switching transistor to be turned on;
- the step of controlling, during a second period of time, the first charging unit to be turned off and the discharging unit to be turned on comprises:
- stopping, during the second period of time, to output the first scan signal to control the first switching transistor to be turned off, and outputting a second scan signal to the gate electrode of the second switching transistor to control the second switching transistor to be turned on;
- the step of controlling, during a third period of time, the discharging unit to be turned off and the second charging unit to be turned on comprises:
- stopping, during the third period of time, to output the second scan signal to control the second switching transistor to be turned off, and outputting a third scan signal to the gate electrode of the third switching transistor to control the third switching transistor to be turned on; and
- the step of controlling, during the fourth period of time, the second charging unit to be turned off comprises:
- stopping, during the fourth period of time, to output the third scan signal to control the third switching transistor to be turned off.

8. The method for pixel driving according to claim 6, wherein the first charging unit comprises a first switching transistor, the discharging unit comprises a second switching transistor, and the second charging unit multiplexes the first switching transistor, and the pre-charge voltage is the data voltage;
- the step of controlling, during a first period of time, the first charging unit to be turned on to charge the energy storage capacitor comprises:
- outputting, during the first period of time, a first scan signal to the gate electrode of the first switching transistor to control the first switching transistor to be turned on;
- the step of controlling, during a second period of time, the first charging unit to be turned off and the discharging unit to be turned on comprises:
- stopping, during the second period of time, to output the first scan signal to control the first switching transistor to be turned off, and outputting a second scan signal to the gate electrode of the second switching transistor to control the second switching transistor to be turned on;
- the step of controlling, during a third period of time, the discharging unit to be turned off and the second charging unit to be turned on comprises:
- stopping, during the third period of time, to output the second scan signal to control the second switching transistor to be turned off, and outputting the first scan signal to the gate electrode of the first switching transistor to control the first switching transistor to be turned on; and
- the step of controlling, during the fourth period of time, the second charging unit to be turned off comprises:
- stopping, during the fourth period of time, to output the first scan signal to control the first switching transistor to be turned off.

9. The method for pixel driving according to claim 8, wherein the pixel driving circuit further comprises: a third switching transistor, wherein a first electrode of the third switching transistor is connected to the energy storage capacitor, and a second electrode of the third switching transistor is connected to a gate electrode of the driving transistor; wherein the discharging unit further comprises: a fourth switching transistor, a first electrode of the fourth switching transistor is connected to the energy storage capacitor, and a second electrode of the fourth switching transistor is connected to the first electrode of the second switching transistor;

the method further comprising:
- outputting, during the second period of time, a fourth scan signal to the gate electrode of the fourth switching transistor to control the fourth switching transistor to be turned on; and outputting, during the fourth period of time, a third scan signal to the gate electrode of the third switching transistor to control the third switching transistor to be turned on.

10. A display panel, comprising: sub-pixels and a pixel drive circuit comprising:
a first charging unit, wherein an input terminal of the first charging unit is configured for inputting a pre-charge voltage, and an output terminal of the first charging unit is connected to an energy storage capacitor, so as to charge the energy storage capacitor when the first charging unit is turned on;
a discharging unit, wherein a first terminal of the discharging unit is connected to the energy storage capacitor, and a second terminal of the discharging unit is connected to a ground, so as to discharge a voltage of the energy storage capacitor to a preset voltage when the discharging unit is turned on;
a second charging unit, wherein an input terminal of the second charging unit is configured for inputting a data voltage, and an output terminal of the second charging unit is connected to the energy storage capacitor, so as to charge the energy storage capacitor when the second charging unit is turned on; and
a driving transistor, wherein a first electrode of the driving transistor is configured for inputting a power supply voltage, a second electrode of the driving transistor is configured for connecting with the sub-pixels, and a gate electrode of the driving transistor is connected to the energy storage capacitor, so as to emit light through the sub-pixels when the energy storage capacitor discharges the gate electrode of the driving transistor;
wherein the second electrode of the driving transistor is connected to the sub-pixels, such that when the energy storage capacitor discharges to the gate electrode of the driving transistor, the driving transistor drives the sub-pixels to emit light.

11. The display panel according to claim 10, wherein the first charging unit comprises a first switching transistor, the discharging unit comprises a second switching transistor, and the second charging unit comprises a third switching transistor;
a first electrode of the first switching transistor is configured for inputting the pre-charge voltage, and a second electrode of the first switching transistor is connected to the energy storage capacitor;
a first electrode of the second switching transistor is connected to the energy storage capacitor, and a second electrode of the second switching transistor is configured for connecting to the ground; and
a first electrode of the third switching transistor is configured for inputting the data voltage, and a second electrode of the third switching transistor is connected to the energy storage capacitor.

12. The display panel according to claim 11, wherein the first electrode of the first switching transistor is connected to the first electrode of the driving transistor, and the pre-charge voltage is the power supply voltage.

13. The display panel according to claim 10, wherein the first charging unit comprises a first switching transistor, the discharging unit comprises a second switching transistor, and the second charging unit multiplexes the first switching transistor, and the pre-charge voltage is the data voltage;
a first electrode of the first switching transistor is configured for inputting the data voltage, and a second electrode of the first switching transistor is connected to the energy storage capacitor; and
a first electrode of the second switching transistor is connected to the energy storage capacitor, and a second electrode of the second switching transistor is configured for connecting to the ground.

14. The display panel according to claim 13, further comprising:
a third switching transistor, wherein a first electrode of the third switching transistor is connected to the energy storage capacitor, and a second electrode of the third switching transistor is connected to a gate electrode of the driving transistor;
wherein the discharging unit further comprises:
a fourth switching transistor, a first electrode of the fourth switching transistor is connected to the energy storage capacitor, and a second electrode of the fourth switching transistor is connected to the first electrode of the second switching transistor.

* * * * *